(12) United States Patent
Azadet et al.

(10) Patent No.: US 11,044,137 B1
(45) Date of Patent: Jun. 22, 2021

(54) ANALOG-TO-DIGITAL CONVERTER SYSTEM, TRANSCEIVER, BASE STATION AND MOBILE DEVICE

(71) Applicant: Intel Corporation, Santa Clara, CA (US)

(72) Inventors: Kameran Azadet, San Ramon, CA (US); Martin Clara, Santa Clara, CA (US); Daniel Gruber, St. Andrae (AT); Christian Lindholm, Villach (AT); Hundo Shin, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/724,458

(22) Filed: Dec. 23, 2019

(51) Int. Cl.
| H03M 1/36 | (2006.01) |
| H04L 27/36 | (2006.01) |
| H03M 1/06 | (2006.01) |
| H03M 1/10 | (2006.01) |
| H04B 1/04 | (2006.01) |

(52) U.S. Cl.
CPC ........ H04L 27/368 (2013.01); H03M 1/0602 (2013.01); H03M 1/1009 (2013.01); *H04B 2001/0425* (2013.01)

(58) Field of Classification Search
CPC .... H04L 27/368; H03M 1/0612; H03M 1/009
USPC ........................................ 341/155, 159, 141
See application file for complete search history.

(56) References Cited

U.S. PATENT DOCUMENTS

| 8,412,116 | B1* | 4/2013 | Kim ...................... H04B 1/403 455/73 |
| 2012/0177368 | A1* | 7/2012 | Aoki ................... H03M 1/1061 398/38 |

FOREIGN PATENT DOCUMENTS

EP    1793500 A1    6/2007

OTHER PUBLICATIONS

U.S. Appl. No. 16/369,262, Intel Corporation, Digital-To-Analog Converter, filed Mar. 29, 2019.
Van Thillo W et al: "A Flexible Antenna Selection Scheme for 60 GHz Multi-Antenna Systems Using Interleaved ADCs"; Communications, 2009. Icc '09. IEEE International Conference on. IEEE, Piscataway, NJ, USA, Jun. 14, 2009, pp. 1-5, XP031505578, ISBN: 978-1-4244-3435-0, p. 1, right-hand column, lines 19-31; Figure 1b.
Louwsma Simon: "Time-Interleaved Analog-to-Digital Converters" In: "Time-Interleaved Analog-to-Digital Converters", Sep. 18, 2010, Springer Netherlands, XP055784074, ISBN: 978-90-48-19716-3, pp. 32-36, paragraph [02.7].

(Continued)

*Primary Examiner* — Peguy Jean Pierre
(74) *Attorney, Agent, or Firm* — 2SPL Patent Attorneys PartG mbB; Kieran O'Leary

(57) ABSTRACT

An Analog-to-Digital Converter, ADC, system is provided. The ADC system comprises a plurality of ADC circuits and a first input for receiving a transmit signal of a transceiver. One ADC circuit of the plurality of ADC circuits is coupled to the first input and configured to provide first digital data based on the transmit signal. The ADC system further comprises a second input for receiving a receive signal of the transceiver. The other ADC circuits of the plurality of ADC circuits are coupled to the second input, wherein the other ADC circuits of the plurality of ADC circuits are time-interleaved and configured to provide second digital data based on the receive signal. Additionally, the ADC system comprises a first output configured to output digital feedback data based on the first digital data, and a second output configured to output digital receive data based on the second digital data.

19 Claims, 2 Drawing Sheets

(56) References Cited

OTHER PUBLICATIONS

Wang Zonghao et al: "Low Feedback Sampling Rate Digital Predistortion for Wideband Wireless Transmitters", IEEE Transactions on Microwave Theory and Techniques, Plenum, USA, vol. 64, No. 11, Sep. 9, 2016, pp. 3528-3539, XP011633253, ISSN: 0018-9480, DOI: 10.1109/TMTT.2016.2602216 [retrieved on Nov. 3, 2016]; abstract; Figure 2.

* cited by examiner

ANALOG-TO-DIGITAL CONVERTER SYSTEM, TRANSCEIVER, BASE STATION AND MOBILE DEVICE

FIELD

The present disclosure relates to analog-to-digital conversion. In particular, examples relate to an Analog-to-Digital Converter (ADC) system, a transceiver, a base station and a mobile device.

BACKGROUND

A digitally assisted transmitter uses a feedback path with an extra ADC to digitize the nonlinear, analog transmit (TX) output. Based on the digital TX feedback data, a Digital Pre-Distortion (DPD) model is trained in order to improve the performance of the transmitter.

The linearity of the TX-observation ADC should at least match the target linearity of the transmitter after the DPD is applied, which in turn means that the TX observation ADC itself should be calibrated before it is used to observe the TX output. The calibration and operation of the TX observation ADC requires a considerable circuit-level overhead such as reference voltage generation, calibration sources, central bias generation, clock interface, digital calibration control, data interfaces etc.

Hence, there may be a desire for an improved ADC architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
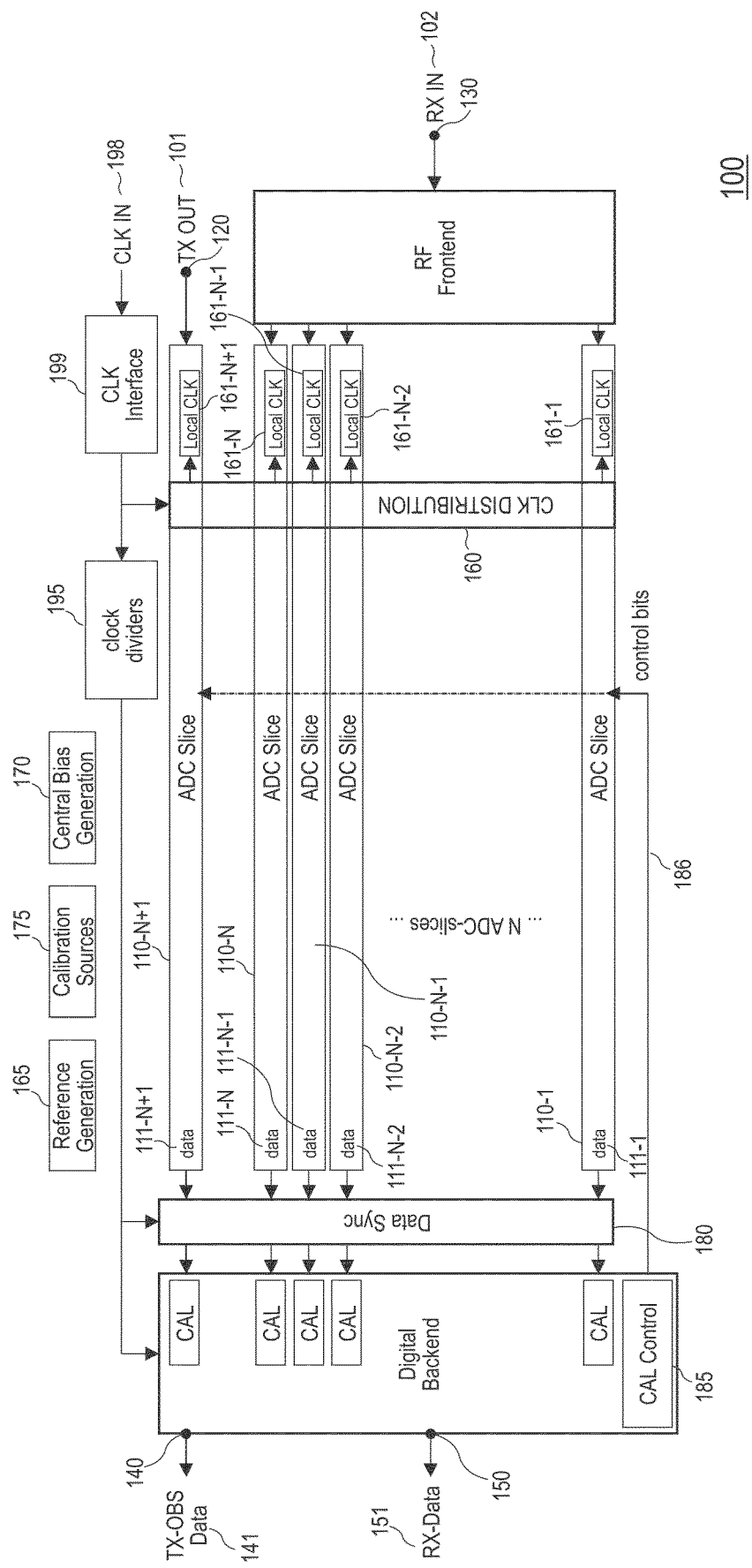
FIG. 1 illustrates an example of an ADC system.

FIG. 1 illustrates an example of an ADC system 100. The ADC system 100 comprises a plurality of ADC circuits 110-1, ..., 110-N and 110-N+1 (which may also be referred to as ADC slices). An ADC circuit of the ADC system 100 may, e.g., be a Successive Approximation Register (SAR) ADC, a flash ADC (also referred to as direct conversion ADC), a pipeline ADC, a sigma-delta ADC or a time-interleaved ADC. If an ADC circuit is a time-interleaved ADC, it may comprise at least two sub-ADC circuits. A sub-ADC circuit may, e.g., be a SAR ADC, a flash ADC, a pipeline ADC or a sigma-delta ADC.

Further, the ADC system 100 comprises a first input (node) 120 for receiving a TX signal 101 of a transceiver (not illustrated). The ADC system 100 additionally comprises a second input (node) 130 for receiving a receive (RX) signal 102 of the transceiver.

The one ADC circuit 110-N+1 of the plurality of ADC circuits 110-1, ..., 110-N and 110-N+1 is coupled to the first input 120 and configured to provide first digital data 111-N+1 based on the TX signal 101. The first digital data 111-N+1 are a digital representation of the analog TX signal 101.

The other ADC circuits 110-1, ..., 110-N of the plurality of ADC circuits 110-1, ..., 110-N and 110-N+1 are coupled to the second input 130. The other ADC circuits 110-1, ..., 110-N of the plurality of ADC circuits 110-1, ..., 110-N and 110-N+1 are time-interleaved (i.e. operated in parallel) and configured to provide second digital data 111-1, ..., 111-N based on the RX signal 102. The second digital data 111-1, ..., 111-N are digital representations of the analog RX signal 102.

A first output (node) 140 of the ADC system 100 is configured to output digital feedback data 141 based on the first digital data 111-1. The digital feedback data 141 may be used by further circuitry (not illustrated) for adjusting of the TX signal generation by the transceiver.

A further second output (node) 150 of the ADC system 100 is configured to output digital receive data 151 based on the second digital data 111-1, ..., 111-N. The digital receive data 151 may be processed by further circuitry to recover the information encoded in the RX signal 102.

The ADC system 100 enables a very efficient implementation of an ADC for observing the TX signal 101, i.e. the TX output. The one ADC circuit 110-N+1 used for observing the TX signal 101 is placed "inside" the array of the other ADC circuits 110-1, ..., 110-N used for observing the RX signal 102. Therefore, the ADC infrastructure for the RX observation ADC circuits 110-1, . . . , 110-N may be reused by the TX observation ADC circuit 110-N+1.

As a consequence, the ADC system 100 may enable very compact TX observation ADC in terms of required chip area and power dissipation.

For example, the TX observation ADC circuit 110-N+1 may reuse the already existing circuitry for the time-interleaved ADC circuits 110-1, . . . , 110-N for low-noise clock distribution, reference voltage generation and distribution, bias generation and distribution (bias voltages and/or bias currents), digital calibration control, digital data synchronization with related generation of extra clocks (e.g. derived from the main (very low-jitter) sampling clock), test signal generation and distribution (voltage, current, associated control signals, which may be static or dynamic). This is further indicated in FIG. 1 by corresponding circuitry providing the above exemplary functionalities.

The ADC system 100 comprises common clock distribution circuitry 160 configured to supply a respective clock signal 161-1, . . . , 161-N and 161-N+1 to the plurality of ADC circuits 110-1, . . . , 110-N and 110-N+1 such that the plurality of ADC circuits 110-1, . . . , 110-N and 110-N+1 can sample their respective analog input signal based on the respective clock signal 161-1, . . . , 161-N and 161-N+1. The clock signals 161-1, . . . , 161-N and 161-N+1 are based on a reference clock signal 198 received at a clock input (node) 199 from an external clock source.

Further, the ADC system 100 comprises common reference voltage generation circuitry 165 configured to generate and supply a respective reference voltage to the plurality of ADC circuits 110-1, . . . , 110-N and 110-N+1.

The ADC system 100 comprises common biasing circuitry 170 configured to generate and supply a respective bias (e.g. a bias voltage and/or a bias current) to the plurality of ADC circuits 110-1, . . . , 110-N and 110-N+1.

Additionally, the ADC system 100 comprises common calibration signal circuitry 175 configured to generate and supply a respective calibration signal to the plurality of ADC circuits 110-1, . . . , 110-N and 110-N+1.

The ADC system 100 comprises common synchronization circuitry 180 configured to synchronize the first digital data 111-1 and the second digital 111-1, . . . , 111-N. For synchronization, one or more synchronization clock signals are used. The synchronization clock signals are generated by a synchronization clock generation circuit 195 (e.g. a frequency/clock divider circuit) based on the clock signal 198.

For calibrating the plurality of ADC circuits 110-1, . . . , 110-N and 110-N+1, the ADC system 100 further comprises common calibration control circuitry 185 configured to supply respective calibration data 186 to the plurality of ADC circuits 110-1, . . . , 110-N and 110-N+1 in order to linearize the plurality of ADC circuits 110-1, . . . , 110-N and 110-N+1.

Further, the ADC system 100 comprises common calibration circuitry 190 configured to generate the digital feedback data 151 and the digital receive data 152 by calibrating (e.g. error correcting) the first digital data 111-1 and the second digital 111-1, . . . , 111-N. For example, the common calibration circuitry 190 may individually calibrate the second digital 111-1, . . . , 111-N provided by the time-interleaved ADC circuits 110-1, . . . , 110-N and subsequently combine the calibrated second digital 111-1, . . . , 111-N to the digital receive data 152. Similarly, the common calibration circuitry 190 may calibrate the first digital data 111-N+1 to obtain the digital feedback data 151.

As indicated in FIG. 1, the functionality of the common calibration control circuitry 185 and the common calibration circuitry 190 may be implemented by a single digital circuit. In other words, the common calibration control circuitry 185 and the common calibration circuitry 190 may be sub-circuits of a single digital circuit. As indicated in FIG. 1, the common calibration control circuitry 185 and the common calibration circuitry 190 may be clocked based on one or more clock signals derived from the reference clock signal 198 (e.g. by same clock signals as used for the synchronization of the first digital data 111-N+1 and the second digital data 111-1, . . . , 111-N).

The ADC system 100 may allow to reuse the already existing extensive calibration circuitry for the high dynamic range operation of the time-interleaved ADC circuits 110-1, . . . , 110-N.

For most of the RX infrastructure circuitry, the TX observation ADC circuit 110-N+1 is effectively indistinguishable from the actual RX ADC circuits 110-1, . . . , 110-N since only the analog input is different. The TX observation ADC circuit 110-N+1 must, by definition, be connected to the analog TX output of the transceiver. The first input 110 may, e.g., be connected directly or indirectly via a passive or active (on-chip) filter to a TX path (not illustrated) of the transceiver that generates the TX signal 101.

The plurality of ADC circuits 110-1, . . . , 110-N and 110-N+1 may be implemented identical. In other words, the ADC circuit 110-N+1 may be a copy of the ADC circuits 110-1, . . . , 110-N such that a copy of an RX ADC circuit is used as a TX observation ADC. In alternative examples, the ADC circuit 110-N+1 may be implemented different than the time-interleaved ADC circuits 110-1, . . . , 110-N.

As indicated in the schematic drawing of FIG. 1, the plurality of ADC circuits 110-1, . . . , 110-N and 110-N+1 are physically arranged in an array (e.g. a one-dimensional, a twodimensional array or a three-dimensional array). In some examples, the ADC circuit 110-N+1 for TX observation may be physically arranged at an edge (a side portion) of the array in order to facilitate feeding of the TX signal 101 to the ADC circuit 110-N+1. However, in general, the ADC circuit 110-N+1 may be physically arranged anywhere within the array of the plurality of ADC circuits 110-1, . . . , 110-N and 110-N+1.

Figure 2:
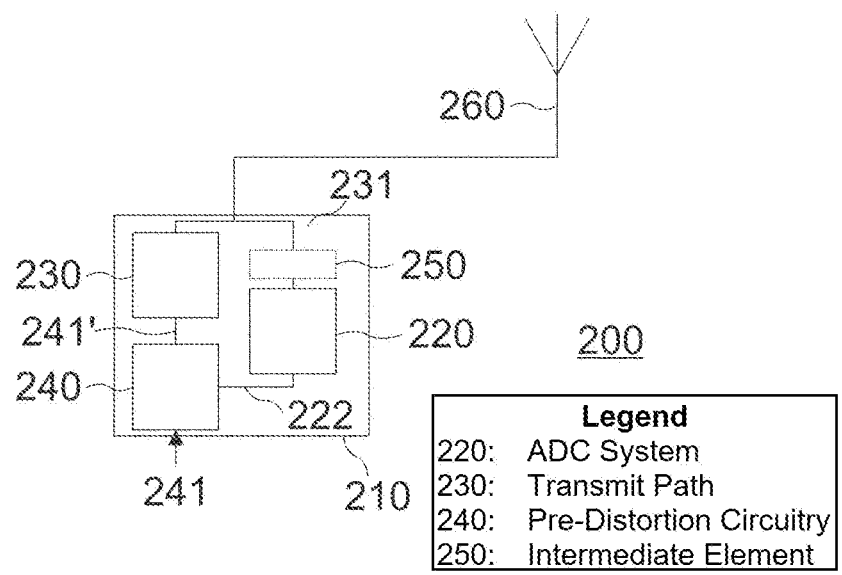
FIG. 2 illustrates an example of a base station.

An example of an implementation using an ADC system according to one or more aspects of the architecture described above in connection with FIG. 1 or one or more examples described above in connection with FIG. 1 is illustrated in FIG. 2. FIG. 2 schematically illustrates an example of a radio base station 200 (e.g. for a femtocell, a picocell, a microcell or a macrocell) comprising an ADC system 220 as proposed.

The ADC system 220 is part of a transceiver 210. The transceiver 210 additionally comprises a transmit path 230 configured to generate the TX signal 231. The first input of the ADC system 220 is coupled to the transmit path 230 such that the one ADC circuit of the ADC system 220 generates the digital feedback data 222 based on the TX signal 231.

Further, the transceiver 210 comprises digital pre-distortion circuitry 240 configured to receive the digital feedback data 222 from the ADC system 220 for training a pre-distortion model for pre-distorting digital transmit data 241. The transmit path 230 is configured to generate the TX signal 231 based on the pre-distorted digital transmit data 241'.

As indicated in FIG. 2, the first input 221 may be coupled to the transmit path 230 via an intermediate element 250 such as a filter or a buffer circuit. For example, if the intermediate element 250 is a filter, the filter may be a passive filter or an active filter. The filter may serve as an anti-alias filter. Additionally or alternatively, the filter may allow to (e.g. linearly) scale an amplitude of the TX signal 231 to the full-scale range of the one ADC circuit of the ADC system 220 used for digitizing the TX signal 231. For example, if the intermediate element 250 is a buffer circuit, the buffer circuit may be an active buffer circuit (e.g. an amplifier in feedback configuration or an open-loop buffer such as a source follower) which itself is directly or indirectly coupled to the transmit path 230. In some examples, the intermediate element 250 may be a scaling circuit (not illustrated) configured to scale (e.g. an amplitude of) the transmit signal. For example, the scaling circuit may be a voltage divider circuit, a capacitive element or a resistive element. In other examples, the intermediate element 250 may represent the scaling circuit and at least one of the filter and the buffer circuit. In still other examples, the intermediate element 250 may be omitted, i.e. the first input 221 may be directly coupled to the transmit path 230.

An antenna element 260 is coupled to the transceiver 210. The antenna element 260 is configured to radiate the TX signal 231 to the environment, and to receive the RX signal digitized by the other time-interleaved ADC circuits of the ADC system 220.

To this end, a base station using a transceiver with a very compact TX observation ADC (in terms of required chip area and power dissipation) may be provided.

The base station 200 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit (I²C) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 3:
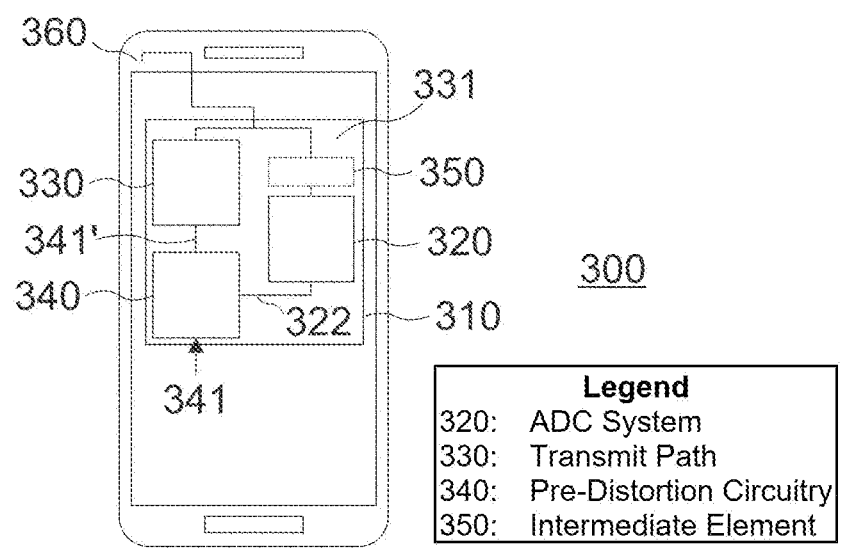
FIG. 3 illustrates an example of a mobile device.

Another example of an implementation using an ADC system according to one or more aspects of the architecture described above in connection with FIG. 1 or one or more examples described above in connection with FIG. 1 is illustrated in FIG. 3. FIG. 3 schematically illustrates an example of a mobile device 300 (e.g. mobile phone, smartphone, tablet-computer, or laptop) comprising an ADC system 320 as proposed.

The ADC system 320 is part of a transceiver 310. The transceiver 310 additionally comprises a transmit path 330 configured to generate the TX signal 331. The first input of the ADC system 320 is coupled to the transmit path 330 such that the one ADC circuit of the ADC system 320 generates the digital feedback data 322 based on the TX signal 331.

Further, the transceiver 310 comprises digital pre-distortion circuitry 340 configured to receive the digital feedback data 322 from the ADC system 320 for training a pre-distortion model for pre-distorting digital transmit data 341. The transmit path 330 is configured to generate the TX signal 331 based on the pre-distorted digital transmit data 341'.

As indicated in FIG. 3, the first input 321 may coupled to the transmit path 330 via an intermediate element 350 such as a filter or a buffer circuit. For example, if the intermediate element 350 is a filter, the filter may be a passive filter or an active filter. The filter may serve as an anti-alias filter. Additionally or alternatively, the filter may allow to (e.g. linearly) scale an amplitude of the TX signal 331 to the full-scale range of the one ADC circuit of the ADC system 320 used for digitizing the TX signal 331. For example, if the intermediate element 350 is a buffer circuit, the buffer circuit may be an active buffer circuit (e.g. an amplifier in feedback configuration or an open-loop buffer such as a source follower) which itself is directly or indirectly coupled to the transmit path 330. In some examples, the intermediate element 350 may be a scaling circuit (not illustrated) configured to scale (e.g. an amplitude of) the transmit signal. For example, the scaling circuit may be a voltage divider circuit, a capacitive element or a resistive element. In other examples, the intermediate element 350 may represent the scaling circuit and at least one of the filter and the buffer circuit. In still other examples, the intermediate element 350 may be omitted, i.e. the first input 321 may be directly coupled to the transmit path 330.

An antenna element 360 is coupled to the transceiver 310. The antenna element 360 is configured to radiate the TX signal 331 to the environment, and to receive the RX signal digitized by the other time-interleaved ADC circuits of the ADC system 320.

To this end, a mobile device using a transceiver with a very compact TX observation ADC (in terms of required chip area and power dissipation) may be provided.

The mobile device 300 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I$^2$C or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using an ADC system according to the proposed architectures or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is an ADC system, comprising: a plurality of ADC circuits; a first input for receiving a transmit signal of a transceiver, wherein one ADC circuit of the plurality of ADC circuits is coupled to the first input and configured to provide first digital data based on the transmit signal; a second input for receiving a receive signal of the transceiver, wherein the other ADC circuits of the plurality of ADC circuits are coupled to the second input, and wherein the other ADC circuits of the plurality of ADC circuits are time-interleaved and configured to provide second digital data based on the receive signal; a first output configured to output digital feedback data based on the first digital data; and a second output configured to output digital receive data based on the second digital data.

Example 2 is the ADC system of example 1, further comprising common clock distribution circuitry configured to supply a respective clock signal to the plurality of ADC circuits.

Example 3 is the ADC system of example 1 or example 2, further comprising common reference voltage generation circuitry configured to supply a respective reference voltage to the plurality of ADC circuits.

Example 4 is the ADC system of any of examples 1 to 3, further comprising common biasing circuitry configured to supply a respective bias to the plurality of ADC circuits.

Example 5 is the ADC system of any of examples 1 to 3, further comprising common synchronization circuitry configured to synchronize the first digital data and the second digital.

Example 6 is the ADC system of any of examples 1 to 5, further comprising common calibration circuitry configured to generate the digital feedback data and the digital receive data by calibrating the first digital data and the second digital.

Example 7 is the ADC system of any of examples 1 to 6, further comprising common calibration signal circuitry configured to supply a respective calibration signal to the plurality of ADC circuits.

Example 8 is the ADC system of any of examples 1 to 7, further comprising common calibration control circuitry configured to supply respective calibration data to the plurality of ADC circuits in order to linearize the plurality of ADC circuits.

Example 9 is the ADC system of any of examples 1 to 8, wherein the plurality of ADC circuits are implemented identical.

Example 10 is the ADC system of any of examples 1 to 9, wherein the plurality of ADC circuits are physically arranged in an array, and wherein the one ADC circuit of the plurality of ADC circuit is physically arranged at an edge of the array.

Example 11 is a transceiver, comprising: an ADC system according to any of examples 1 to 10; a transmit path configured to generate the transmit signal, wherein the first input is coupled to the transmit path; and digital receive circuitry configured to process the digital receive data.

Example 12 is the transceiver of example 11, further comprising digital pre-distortion circuitry configured to receive the digital feedback data from the ADC system for training a pre-distortion model for pre-distorting digital transmit data.

Example 13 is the transceiver of example 12, wherein the transmit path is configured to generate the transmit signal based on the digital transmit data.

Example The transceiver of any of examples 11 to 13, wherein the first input is coupled to the transmit path via a filter.

Example 15 is the transceiver of any of examples 11 to 14, wherein the first input is coupled to the transmit path via a buffer circuit.

Example 16 is the transceiver of any of examples 11 to 15, wherein the first input is coupled to the transmit path via a scaling circuit configured to scale the transmit signal.

Example 17 is a base station, comprising: transceiver according to any of examples 11 to 16; and at least one antenna element coupled to the transceiver.

Example 18 is the base station of example 17, wherein the receive signal is received by the antenna element.

Example 19 is a mobile device, comprising: transceiver according to any of examples 11 to 16; and at least one antenna element coupled to the transceiver.

Example 20 is the mobile device of example 19, wherein the receive signal is received by the antenna element.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An Analog-to-Digital Converter, ADC, system, comprising:
    a plurality of ADC circuits;
    a first input for receiving a transmit signal of a transceiver, wherein one ADC circuit of the plurality of ADC circuits is coupled to the first input and configured to provide first digital data based on the transmit signal;
    a second input for receiving a receive signal of the transceiver, wherein the other ADC circuits of the plurality of ADC circuits are coupled to the second input, and wherein the other ADC circuits of the plurality of ADC circuits are time-interleaved and configured to provide second digital data based on the receive signal;
    a first output configured to output digital feedback data based on the first digital data;
    a second output configured to output digital receive data based on the second digital data; and
    common biasing circuitry configured to supply a respective bias to the plurality of ADC circuits.

2. The ADC system of claim 1, further comprising common clock distribution circuitry configured to supply a respective clock signal to the plurality of ADC circuits.

3. The ADC system of claim 1, further comprising common reference voltage generation circuitry configured to supply a respective reference voltage to the plurality of ADC circuits.

4. The ADC system of claim 1, further comprising common synchronization circuitry configured to synchronize the first digital data and the second digital.

5. The ADC system of claim 1, further comprising common calibration circuitry configured to generate the digital feedback data and the digital receive data by calibrating the first digital data and the second digital.

6. The ADC system of claim 1, further comprising common calibration signal circuitry configured to supply a respective calibration signal to the plurality of ADC circuits.

7. The ADC system of claim 1, further comprising common calibration control circuitry configured to supply respective calibration data to the plurality of ADC circuits in order to linearize the plurality of ADC circuits.

8. The ADC system of claim 1, wherein the plurality of ADC circuits are implemented identical.

9. The ADC system of claim 1, wherein the plurality of ADC circuits are physically arranged in an array, and wherein the one ADC circuit of the plurality of ADC circuit is physically arranged at an edge of the array.

10. A transceiver, comprising:
an ADC system according to claim 1;
a transmit path configured to generate the transmit signal, wherein the first input is coupled to the transmit path; and
digital receive circuitry configured to process the digital receive data.

11. The transceiver of claim 10, further comprising digital pre-distortion circuitry configured to receive the digital feedback data from the ADC system for training a pre-distortion model for pre-distorting digital transmit data.

12. The transceiver of claim 11, wherein the transmit path is configured to generate the transmit signal based on the digital transmit data.

13. The transceiver of claim 10, wherein the first input is coupled to the transmit path via a filter.

14. The transceiver of claim 10, wherein the first input is coupled to the transmit path via a buffer circuit.

15. The transceiver of claim 10, wherein the first input is coupled to the transmit path via a scaling circuit configured to scale the transmit signal.

16. A base station, comprising:
transceiver according to claim 10; and
at least one antenna element coupled to the transceiver.

17. The base station of claim 16, wherein the receive signal is received by the antenna element.

18. A mobile device, comprising:
transceiver according to claim 10; and
at least one antenna element coupled to the transceiver.

19. The mobile device of claim 18, wherein the receive signal is received by the antenna element.

* * * * *